United States Patent [19]

Cohen et al.

[11] 4,193,797
[45] Mar. 18, 1980

[54] METHOD FOR MAKING PHOTORESISTS

[75] Inventors: Abraham B. Cohen, Springfield; Robert B. Heiart, Middletown, both of N.J.

[73] Assignee: E. I. DuPont de Nemours and Company, Wilmington, Del.

[21] Appl. No.: 308,856

[22] Filed: Nov. 22, 1972

Related U.S. Application Data

[63] Continuation-in-part of Ser. No. 126,925, Mar. 22, 1971, abandoned, which is a continuation-in-part of Ser. No. 833,740, Jun. 16, 1969, abandoned, which is a continuation-in-part of Ser. No. 602,291, Dec. 16, 1966, Pat. No. 3,547,730.

[51] Int. Cl.² .................................................. G03c 5/00
[52] U.S. Cl. ...................................... 430/258; 430/260
[58] Field of Search ........................ 96/35.1, 115 R, 33

[56] References Cited

U.S. PATENT DOCUMENTS

| | | | |
|---|---|---|---|
| 3,046,120 | 7/1962 | Schmidt et al. | 96/33 |
| 3,126,281 | 3/1964 | Sus et al. | 96/33 |
| 3,395,016 | 7/1968 | Loeb | 96/35.1 |
| 3,493,371 | 2/1970 | Poot | 96/115 R |
| 3,526,504 | 9/1970 | Celeste | 96/35.1 |
| 3,592,646 | 7/1971 | Holstead et al. | 96/115 R |

*Primary Examiner*—David Klein

[57] ABSTRACT

A process for forming a photoresist which comprises:
(1) applying to a surface the surface of a solid unexposed photosensitive layer of thermoplastic photosoluble or photodesensitizable material, the other surface being adhered to a film support, then in either order
(2) exposing the layer, and
(3) stripping the support, and then
(4) washing away the exposed areas of the layer.

The surface bearing the resist can be etched, plated, or treated in other ways.

16 Claims, No Drawings

METHOD FOR MAKING PHOTORESISTS

CROSS-REFERENCES TO RELATED APPLICATIONS

This application is a continuation-in-part of our application Ser. No. 126,925, filed Mar. 22, 1971, now abandoned, which is a continuation-in-part of application Ser. No. 833,740, filed June 16, 1969, now abandoned, which is a continuation-in-part of application Ser. No. 602,291, filed Dec. 16, 1966, now U.S. Pat. No. 3,547,730 issued Dec. 15, 1970.

BACKGROUND OF THE INVENTION

This invention relates to processes and elements for making photoresists with photosensitive thermoplastic materials.

In processes of the prior art, the resist material is applied to the metal or other permanent surface as a liquid coating and then exposed to light either in a liquid gellable state or in a dry state. The coating is done by dipping, whirling or roller coating. This is inconvenient in many cases because of the requirement that either the support, e.g., metal, must be coated at the point of manufacture of the resist composition, or the said composition must be shipped to the user of the resists who must then coat the composition. These piece by piece operations are generally wasteful of resist composition and produce coatings of marginal quality and uniformity. Either procedure has many obvious disadvantages. One of these is that liquid coatings applied to perforated circuit boards in certain cases where electroplating is to be done clog the perforations and prevent making the electrical connections to both sides of the board through the perforations. Another disadvantage is that the preparation of photoresists by the above processes involves long drying times by the user and a high risk of dust particles settling on the coated surface during the drying period.

It has been found that these disadvantages of the prior art may be eliminated by the use of preformed resist films of photosensitive material. More specifically, it has been discovered that photoresists may be produced by laminating a thin layer of a positive-working material to a support and then imaging and developing it. U.S. Pat. No. 3,469,982, issued Sept. 30, 1969, to Celeste, describes a method of making a photoresist by laminating a negative-working, photopolymerizable layer to a support and further treating it so as to produce a resist image. The lamination is carried out by coating the photopolymerizable material on a film support, the upper surface being uncovered or having a protective cover sheet which is removed prior to lamination. The photopolymerizable material is coated on the film support as a very thin layer (e.g., 0.00035 inch), and must accordingly have physical characteristics suitable for transfer as a thin, dry layer, particularly where it is to be rolled up for storage prior to lamination.

Photopolymerizable (i.e., negative-working) photoresist materials are suitable for use in such a process since they contain a substantial proportion of an ethylenically unsaturated photopolymerizable monomer, which presents no problem when transferred as a dry layer. Moreover, the monomer often acts as a plasticizer for the binder that may be used in the photopolymerizable layer (see U.S. Pat. No. 3,469,982, Column 1, lines 35-37). In fact, this plasticization of the binder can occur to such an extent with some monomers as to present the problem of excessive softness (see U.S. Pat. No. 3,261,686 to Celeste and Bauer, issued July 19, 1966, Column 1, lines 41-51, and U.S. Pat. No. 3,380,831 to Cohen and Shoenthaler, issued Apr. 30, 1968, Column 1, lines 64-70).

Just the opposite problem would be expected when using positive-working materials (i.e., not photopolymerizable) in a process similar to that described in U.S. Pat. No. 3,469,982. Positive-working photosensitive materials are solubilized or decomposed, rather than polymerized, in areas exposed to light. Thus, they contain material which is already polymerized and do not contain photopolymerizable monomers. Frequently these materials contain thermosetting resins or highly crosslinked colloids. A dry layer, containing polymer unplasticized by monomer, must therefore be transferred in the process of the invention, rather than a plasticized, monomer-containing layer as in the above-cited patent. The layer must also have adequate flexibility and adhesion to the substrate to which it is laminated. Surprisingly, both transferability and adhesion are achieved with the positive-working photosensitive materials of the invention, even though they contain no photopolymerizable monomer. This is particularly unexpected since positive-working materials are generally ionic or strongly polar and are often water-soluble. Such materials would not be expected to form flexible thermoplastic layers having good adhesion to metal substrates. It has been found, however, that the positive-working materials of this invention are operable in the process of the invention even though they contain no photopolymerizable monomer to plasticize them.

SUMMARY OF THE INVENTION

It is an object of this invention to provide a new and improved process for producing photoresists. Another object is to provide a rapid and practical positive-working process for producing a durable photoresist. It is a further object of this invention to provide preformed resist films of photosensitive thermoplastic material. Still further objects will be apparent from the following description of the invention.

The process of this invention for forming photoresists on metal or other surfaces, including glass, ceramics, etc., comprises:

(1) applying to such surface the surface of a solid, unexposed, positive-working photosensitive layer, comprised of a resist-forming photosoluble or photodensensitizable composition, which is preferably selected from (a) a flexible, photosoluble, thermoplastic macromolecular organic polymer having recurring pendent o-quinone diazide groups chemically bonded to said polymer, said composition being substantially free of groups which will react with the photoreaction products of said o-quinone diazide groups, and (b) a photodesensitizable mixture of a photosensitive bis-diazonium salt and a thermoplastic macromolecular organic colloid, wherein the cation portion of said salt is of the formula:

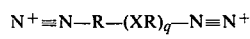

wherein
R is an aromatic hydrocarbon nucleus, a polynuclear quinone nucleus, or an aromatic heterocyclic nucleus, and —N≡N+ is attached to cyclic carbon atoms of said R;

X is an alkylene or arylene nucleus or an azo or sulfone group, or an alkylenedioxy or arylenedioxy group;

q is 0 or 1, and when q is 1 and X is alkylenedioxy or arylenedioxy, R is aroyl or arylsulfonyl and is attached to said alkylenedioxy or arylenedioxy by the carbonyl of the aroyl or the sulfonyl of the arylsulfonyl, the anion portion of the salt is an anion of an inorganic salt, and said thermoplastic macromolecular organic colloid is a substantially unhardened, macromolecular organic colloid having pendent recurring hydroxyl or amino groups and is crosslinkable in the presence of said diazonium salt in basic environment, the other surface of the layer having adhered thereto with low to moderate adherence a thin, flexible, polymeric film support (e.g., 0.00025–0.008 inch or more in thickness); preferably with heating or later heating at a temperature from 40° C. to about 150° C. to increase the degree of adherence between said surface and said layer; then in either order, (2) exposing the layer, imagewise, to actinic radiation to form an image; and (3) stripping the film support from the resulting image-bearing layer; and (4) washing away the exposed areas of the layer to form a resist image of thermoplastic material.

When the resist is photodesensitizable, the step of washing away the exposed areas includes insolubilizing the unexposed areas so that they are not washed away. This is accomplished by treating the resist with a basic reagent concurrent with or preceding the removal of the exposed areas, which increases the insolubility of the unexposed areas in the developing solvent.

The surface can then be treated with a suitable reagent to form an etched surface, or plated or processed in other ways. The image can then be removed by means of a solvent therefor with the aid of mechanical action, e.g., by rubbing, brushing and/or abrading, etc., or by a combination of one or more such steps.

DESCRIPTION OF THE PREFERRED EMBODIMENT

Photosensitive elements useful in accordance with this invention can be made by coating a photosensitive stratum onto a thin, flexible film base or support, which preferably has a high degree of dimensional stability to temperature changes and drying the coated layer. In ganeral, the film support will be chosen so that, at best, there is only a moderate amount or degree of adherence between the coating and the support.

Photoresist films for practicing this invention can be made in several ways. One method, described in assignee's patent by Roos, U.S. Pat. No. 3,837,860, issued Sept. 24, 1974, filed June 16, 1969, comprises reacting a polymer having pendent hydroxyl groups with a diazo quinone sulfonyl halide to yield a photosoluble polymer with pendent diazo quinone groups. This thermoplastic macromolecular compound is insoluble until struck by light or radiation whereupon it becomes a polymer with pendent carboxylic acid groups and thus is soluble in base similar to the description by Kosar, J., in *Light Sensitive Systems (J. Wiley & Sons, N.Y.,* 1965) at page 342. Another method described in assignee's patent by Roos, U.S. Pat. No. 3,778,270, issued Dec. 11, 1973, filed Nov. 12, 1970, comprises mixing a bis-diazonium salt with a polymer having pendent hydroxyl or amino groups; this soluble, photodesensitizable composition is image-exposed resulting in a photo-decomposition of the bis-diazonium salt in the exposed areas. The film is then treated with base, making the unexposed areas insoluble by virtue of the reaction of the salt with the pendent hydroxyl organic groups, thus crosslinking the polymers. The exposed areas are washed away with a suitable solvent, leaving a positive image. The two types of photosensitive materials useful in the invention are, accordingly, the photosoluble polymers, in which the photoreaction products of the polymers have a greater solubility, particularly in a basic solution, than the unexposed polymer, and the photodesensitizable organic colloids in which exposed areas are desensitized to the crosslinking action of a basic reagent, both as more particularly described in the above Roos patents, the disclosures of which are incorporated herein by reference.

The photosoluble, resist compositions useful in this invention are prepared by esterifying an o-quinone diazide in the presence of a synthetic or natural colloid having pendent hydroxyl groups. A preferred method for making this polymer composition is by exhaustive esterification of 2-diazo-1-naphthol-4-sulfonyl chloride, in the presence of poly(methyl methacrylate/hydroxyethyl methacrylate). The o-quinone diazides useful in preparing photosoluble resist compositions and elements have a carboxylic or sulfonic acid constituent, capable of undergoing esterification, with pendent hydroxyl groups of the synthetic or natural colloid. The colloids which are useful in preparing the photosoluble resist compositions are thermoplastic, synthetic or naturally occurring, and have pendent recurring hydroxyl groups, e.g., polymeric polyols such as polyvinyl alcohol, hydroxy-substituted addition polyesters such as polyacrylic or polymethacrylic acid esters, hydroxy-substituted copolymers such as poly(methyl methacrylate/hydroxyethyl methacrylate), or natural colloids such as gelatin, glue and shellac. The esterified colloid is thermally stable to 150° C. and is a suitable coating composition for the photosensitive elements useful in this invention.

The photodesensitizable resist compositions useful in this invention are comprised of a thermoplastic, flexible, crosslinkable, film-forming mixture of a thermoplastic macromolecular colloid having recurring pendent hydroxy or amino groups and a bis-diazonium salt that decomposes upon exposure to actinic light. Colloids useful in the crosslinkable compositions are synthetic or naturally occurring and have pendent recurring hydroxyl or amino groups, e.g., polymeric polyols; or natural colloids such as gelatin, glue and shellac; addition polyesters, e.g., partially hydroxy-substituted polyacrylic and polymethacrylic acid esters; addition copolyesters such as poly(methyl methacrylate/hydroxyethyl methacrylate); polyvinyl alcohol; poly-p-aminostyrene; etc.

Bis-diazonium salts useful in the photodesensitizable resist composition are exemplified by the formula of the cation portion hereinbefore described:

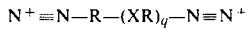

$$N^+\equiv N-R-(XR)_q-N\equiv N^+$$

where R is an aromatic hydrocarbon nucleus, a polynuclear quinone nucleus or an aromatic nucleus, X is alkylene or arylene nucleus or an azo, sulfone, alkylenedioxy or arylenedioxy group and q is 0 or 1. Suitable aromatic nuclei are benzene, naphthalene, acenaphthene, anthracene, and phenanthrene. Suitable polynuclear quinone nuclei are anthraquinone and phenanthraquinone, and suitable heterocyclic nuclei are pyrazole and acridine. The nuclei may be substituted, e.g., by Cl, Br, alkyl of 1 to 4 carbons, and alkoxy of 1 to 4 carbon atoms, including methyl, ethyl, propyl, and butyl, and the corresponding alkoxy radicals. Among the useful alkylene radicals are tetramethylene and polymethylene of 5 to 18 carbons. Suitable arylenes are phenylene and naphthylene.

Preferred compounds have a cation of the formula

$$N^+ \equiv N-R'-Y-(CH_2)_n-Y-R'-N \equiv N^+$$

wherein R' is a benzene, naphthalene, anthracene or phenanthrene radical, Y is —COO— or —SO$_3$—, n is 4 to 18, and R' is attached to the carbon or sulfur atom of —COO— or —SO$_3$— respectively. Suitable salt-forming compounds are zinc chloride, and acids or salts wherein the anion is fluoborate, sulfate, fluosulfonate, oxalate, citrate, etc.

The following bisdiazonium salts are useful in the photodesensitizable crosslinkable mixtures:
(1,4-butanediol)dibenzoate-4,4'-bis(diazonium zinc chloride)
(1,5-pentanediol)dinaphthoate-5,5'-bis(diazonium zinc chloride)
(1,4-butanediol)dinaphthylsulfonate-4,4'-bis(diazonium fluoborate)
(1,4-butanediol)dinaphthyl-6-sulfonate-2,2'-bis[methyl]-1,1'-bis(diazonium fluoborate)
resorcinol dibenzoate-4,4'-bis(diazonium zinc chloride)
(2,4-pyridinediol) dibenzoate-4,4'-bis(diazonium zinc chloride)
benzene-1,4-bis(diazonium fluoborate)
benzene-1,3-bis(diazonium fluoborate)
naphthalene-1,5-bis(diazonium fluoborate)
naphthalene-1,5-bis(diazonium fluoborate)-7-sulfonic acid
anthracene-1,6-bis(diazonium fluoborate)
anthracene-1,5-bis(diazonium fluoborate)-7-sulfonic acid anthraquinone-1,6-bis(diazonium fluoborate)
phenanthrene-1,5-bis(diazonium fluoborate)
fluorene-2,7-bis(diazonium fluoborate)
acenaphthene-4,6-bis(diazonium fluoroborate)
2,6-dimethoxypyridine-3,5-bis(diazonium fluoborate)
pyrazole-3,5-bis(diazonium fluoborate)
acridine-3,6-bis(diazonium fluoborate)
biphenyl-4,4'-bis(diazonium fluoborate)
biphenyl-4,4'-bis(diazonium fluoborate)-2,2'-bis sulfonic acid
2,2'-dimethyl-biphenyl-4,4'-bis(diazonium fluoborate)
diphenylmethane-4,4'-bis(diazonium fluoborate)
1,2-diphenylethane-4,4'-bis(diazonium fluoborate)
1,3-diphenylisobutane-4,4'-bis(diazonium fluoborate)
p-terphenyl-4,4'-bis(diazonium fluoborate)
diphenylsulphone-4,4'-bis(diazonium fluoborate)
azobenzene-4,4'-bis(diazonium fluoborate).

An exemplary procedure and a preferred method for making the salts is by diazotization of the respective bisamines and specific examples of preparation of the salts and their use in crosslinkable-photosensitive compositions are disclosed in the copending application of Roos, U.S. Pat. No. 3,778,270. Once prepared, however, the bis-diazonium salts of this invention are stable thermally and can be used to prepare crosslinkable-photosensitive compositions and elements in further accord with this invention.

The photosensitive layer is formed by coating a positive-working, photosensitive composition on a film support.

In practicing a preferred embodiment of the invention, an element containing an image-yielding photosensitive stratum is made by coating a thin layer of photosensitive composition comprising either a polymer with pendent diazo quinone groups or a polymer with pendent hydroxyl groups and a bis-diazonium salt on a suitable film support. The appropriate thickness of this thin layer for any particular application will be apparent to those in the art. A thickness of 0.0003-inch or greater is preferred for most plastic binders. A surprising feature of this invention is that such thin dry layers, which contain no plasticizing monomer, may be transferred on the film support without rupture or other damage.

A suitable support film may be chosen from a wide variety of films composed of high polymers, e.g., polyamides, polyolefins, polyesters, vinyl polymers, and cellulose esters. The support thickness is not critical and will depend on the modulus of the polymer. The higher the modulus the thinner the support can be; generally, a thickness from 0.00025-inch to 0.008-inch or more will be used. If exposure is to be made before removing the support film, it must transmit a substantial fraction of the actinic radiation incident upon it, otherwise, no such restrictions apply. A particularly suitable film is a transparent polyethylene terephthalate film about 0.00025–0.002-inch thick. Suitable removable cover films may be chosen from the same group of high polymer films described above and may have the same wide range of thicknesses, provided the degree of adhesion between the cover film and the resist layer is less than that between the support film and the resist layer. A cover film of 0.001-inch thick polyethylene is especially suitable. Support and cover films provide good protection to the photosensitive resist layer. To apply the resist to, say, a copper-clad Fiberglas ® rigid support to be used as a printed circuit, the cover film is stripped from the element, and the resist layer on its supporting film is then laminated with heated resilient pressure rolls to the copper surface of the rigid support. This provides a sensitized surface ready immediately for exposure but still protected by the original support film. To produce a resist image the element is image-exposed through the support film and said film is then peeled off and the resist is developed by washing away the exposed areas with solvent which results in a rigid support bearing a relief resist image on its surface. In the particular instance when the resist is photodesensitizable the resist is preferably treated with an insolubilizing reagent just prior to solvent washout. In this instance the exposed resist is reacted with the fumes of ammonia or an organic amine to harden the unexposed areas. The element is then developed by washing away the unhardened exposed areas with solvent. Either an aqueous or an organic solvent may be used in the development process depending on the nature of the colloid used in the crosslinkable-photosensitive composition. An aqueous solvent is used when the colloid is a hydrophilic compound, and an organic solvent is used when the colloid is a hydrophobic, oleophilic compound.

The washed out element is useful as a relief or a positive working resist image.

The following examples are intended to further illustrate the two aspects of the invention, however, the scope of the invention is not intended to be limited thereby.

EXAMPLE I

This example illustrates a photosoluble composition in the process of the invention.

An electrical printed circuit was made as described below. According to the invention of Roos, U.S. Pat. No. 3,837,860 a batch of 2-diazo-1-naphthol-4-sulfonyl chloride was prepared. Six grams of the chloride were added to 10 ml of dioxane and this mixture was slowly added to a 50 ml dioxane solution containing 1 gram of a copolymer of methyl methacrylate and hydroxymethyl methacrylate 90/10. Upon additon of 5 ml of a 1% solution of sodium carbonate, the solution turned purple. This yielded a copolymer having pendant diazo quinone groups. The copolymer was precipitated with water, collected and dissolved in dioxane. This solution was coated using a doctor blade set 0.002-inch from the web onto a web of polyethylene terephthalate transparent film and allowed to dry to give a coating thickness of 0.00035-inch. The resist coating with its support film was laminated to a clean piece of copper-clad, epoxy-Fiberglass ® board with the surface of the photosensitive layer in contact with the copper surface. The lamination was carried out with the aid of rubber covered rollers at 120° C. The resulting resist covered element was image-exposed through a transparency with a positive image of the electrical circuit pattern on it for three minutes using a 500-watt mercury light source at a distance of 16 inches. After exposure, the polyethylene terephthalate support film was stripped from the resist. The board was then developed by washing out the exposed areas with a 5% aqueous trisodium phosphate. This step left the resist on the copper in the pattern of the opaque areas of the exposing transparency, thus giving a positive image. The copper areas exposed by washout of the soluble resist corresponding to the clear areas of the exposing transparency was etched away down to the epoxy-Fiberglas ® by placing the board in a 45° Baume ferric chloride solution. This left the resist-covered copper conducting pattern on the Fiberglas ® board. The resist was finally removed from the copper circuit using a commercially available stripping agent of methanol and dichloromethane 10/90.

EXAMPLE II

This example illustrates a photodesensitizable composition in the process of the invention.

One half gram (1,4-butanediol)dibenzoate-4,4'-bis(-diazonium zinc chloride), prepared as described in U.S. Pat. No. 3,778,270, was dissolved in 25 ml. of acetone containing 2.5 grams of a copolymer of methyl methacrylate and hydroxyethyl methacrylate 90/10, 0.5 gram of p-toluene-sulfonic acid, 1 gram of triethylene glycol diacetate, 2 cc. of ethanol and 1 ml. of water. This mixture was coated on a web of polyethylene terephthalate and dried to a thickness of about 0.00035 inch. This film was laminated to a copper-clad board as described in Example I. The board was then image-exposed for 2 minutes using a positive-image transparency of an electrical circuit with a 2500-watt, 45-ampere carbon arc light source at a distance of 24 inches. After exposure, the polyethylene terephthalate film was stripped from the resist. The board was dipped into ammonia fumes, thus insolubilizing the unexposed areas by crosslinkage of the polymer chains. The board was developed by washing out the exposed areas of the resist with 1,1,1-trichlorethane. The board was then etched and the resist stripped as in Example I, leaving a positive copper image of the transparency pattern.

This process is useful for making decorative photoengravings and chemically milled and electro-formed elements.

The process of the invention may be used to etch metal surfaces of magnesium, zinc, copper, alloys of such metals, aluminum, anodized and dyed anodized aluminum, steel, steel alloys, beryllium-copper alloys.

The process of this invention has many advantages over the prior art. It eliminates the special coating and drying reuqirements imposed on users of the resists in applying liquid coatings to individual pieces to be imaged. The invention offers a simple and easy method of rapidly applying a highly uniform resist material to the object to be imaged. An object to be imaged can be sensitized and ready for exposure in seconds as opposed to minutes or hours for the conventional methods of forming resists which involve coating and drying at the site of use. In addition, the sensitized object can be completely protected from dirt and abrasion by virtue of the fact that the original support film acts as a protective cover sheet after the resist element is applied to the surface to be imaged. The photoresist layers can be sandwiched between two polymeric films during manufacture and can easily be stocked as inventory and easily handled without damage until ready for use. The manufacture of the sandwiched photoresist element is easily carried out with high precision on the continuous web coating machinery well known in the photographic manufacturing industry.

In the process of the present invention, coatings of the resist on its supporting film can be made on precision continuous web coating machinery capable of highly uniform application over large areas. Dryers can remove all solvent from the coatings before the web is wound up. These operations, if carried out under clean conditions, especially if a cover film is laminated to the resist coating, can produce extremely high quality, dirt-free resist coatings which are completely protected in the sandwich form until use. This also facilitates thorough inspection during manufacture. To make a resist image on, for example, a metal support such as copper, it is only necessary to strip off the laminated cover film and laminate the uncovered surface of the photoresist layer to the metal support. The resist layer is still protected from lint, dust and other kinds of harmful dirt as well as from abrasion, scratches, etc. by the original support film. At the same time, it can be easily exposed through said film. The whole operation of the process of the invention is much less time-consuming and much simpler to carry out by the user than the processes of the prior art.

The embodiments of the invention in which an exclusive property or privilege is claimed are defined as follows:

1. A process for forming a positive photoresist on a surface which comprises:
    (1) applying to said surface the surface of a solid, unexposed, positive-working, photosensitive layer comprised of a resist-forming photosoluble or photodesensitizable composition, the other surface of the layer having adhered thereto with low to moderate adherence a thin, flexible, polymeric film support; then in either order,
    (2) exposing the layer, imagewise, to actinic radiation to form an image, (3) stripping the film support from the resulting image-bearing layer; and then,
(4) washing away the exposed areas of the layer to form a positive resist image of thermoplastic material.

2. A process according to claim 1 wherein said photosoluble composition is a flexible, photosoluble, macromolecular organic polymer having recurring pendent o-quinone diazide groups chemically bonded to said polymer, said composition being substantially free of groups which will react with the photoreaction products of said o-quinone diazide groups.

3. A process according to claim 1 wherein said photodesensitizable composition is a mixture of a photosensitive bis-diazonium salt and a thermoplastic macromolecular organic colloid, wherein the cation portion of said salt is of the formula:

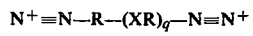

wherein
R is an aromatic hydrocarbon nucleus, a polynuclear quinone nucleus, or an aromatic heterocyclic nucleus, and $-N\equiv N^+$ is attached to cyclic carbon atoms of said R;
X is an alkylene or arylene nucleus or an azo or sulfone group, or an alkylenedioxy or arylenedioxy group;
q is 0 or 1, and when q is 1 and X is alkylenedioxy or arylenedioxy, R is aroyl or arylsulfonyl and is attached to said alkylenedioxy or arylenedioxy by the carbonyl of the aroyl or the sulfonyl of the arylsulfonyl,
the anion portion of the salt is an anion of an inorganic salt, and said thermoplastic marcromolecular organic colloid is a substantially unhardened, macromolecular organic colloid having pendent recurring hydroxyl or amino groups and is crosslinkable in the presence of said diazonium salt in basic environment.

4. A process according to claim 3 wherein said bis-diazonium salt has a cation of the formula:

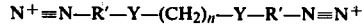

wherein R' is a benzene, naphthalene, anthracene or phenanthrene radical, Y is $-COO-$ or $-SO_3-$, n is 4 to 18, and R' is attached to the carbon or sulfur atom of $-COO-$ or $-SO_3-$ respectively.

5. A process according to claim 1, wherein prior to step (2) the layer is heated to a temperature up to 150° C. to increase the degree of adherence between the layer and said surface.

6. A process according to claim 1, wherein said surface is an etchable, inorganic surface.

7. A process according to claim 1, wherein said surface is a clean metal surface.

8. A process according to claim 1, wherein said surface is a copper surface.

9. A process according to claim 1, wherein said surface is an aluminum surface.

10. A process according to claim 1, wherein said surface is an anodized aluminum surface.

11. A process according to claim 3, wherein said step of washing away the exposed areas includes insolubilizing the unexposed areas by treating the resist with a basic reagent concurrent with or preceding the removal of the exposed areas.

12. A process for obtaining a positive image of an original on a receptor surface, the process comprising the steps of:
(a) providing a light-sensitive sheet comprising a flexible, dimensionally stable carrier sheet having releasably bonded to one surface thereof a layer of photosolubilizable material, said photosolubilizable material having a stick temperature between about 40° C. and 150° C.;
(b) forming a firm bond between said photosolubilizable material and a receptor surface; then in either order of (c) and (d);
(c) exposing said photosolubilizable material to actinic radiation in an image-wise pattern through an original;
(d) removing said carrier sheet from said layer of photosolubilizable material;
(e) removing exposed areas of said photosolubilizable layer, whereby a positive image of said original is obtained on said receptor surface.

13. The process of claim 12 wherein said flexible carrier sheet is untreated polyester.

14. The process of claim 13 wherein said untreated polyester is polyethylene terephthalate.

15. The process of claim 12 wherein said receptor comprises a dielectric substrate having a thin layer of metal bonded to at least one surface thereof, and wherein said photosolubilizable layer is bonded to said metal layer.

16. The process of claim 15 wherein said metal layer is copper.

* * * * *

REEXAMINATION CERTIFICATE (299th)

United States Patent [19]

Cohen et al.

[11] B1 4,193,797

[45] Certificate Issued Feb. 5, 1985

[54] METHOD FOR MAKING PHOTORESISTS

[75] Inventors: Abraham B. Cohen, Springfield; Robert B. Heiart, Middletown, both of N.J.

[73] Assignee: E.I. DuPont de Nemours and Company, Wilmington, Del.

Reexamination Request:
No. 90/000,234, Jul. 30, 1982

Reexamination Certificate for:
Patent No.: 4,193,797
Issued: Mar. 18, 1980
Appl. No.: 308,856
Filed: Nov. 22, 1972

Related U.S. Application Data

[63] Continuation-in-part of Ser. No. 126,925, Mar. 22, 1971, abandoned, which is a continuation-in-part of Ser. No. 833,740, Jun. 16, 1969, abandoned, which is a continuation-in-part of Ser. No. 602,291, Dec. 16, 1966, Pat. No. 3,547,730.

[51] Int. Cl.³ .. G03C 5/00; G03C 11/12; G03F 7/26
[52] U.S. Cl. ... 430/258; 430/260; 430/323; 430/324; 430/326
[58] Field of Search ...... 430/252, 258, 253, 260, 254, 430/325, 326, 324, 323

[56] References Cited

U.S. PATENT DOCUMENTS

| | | | |
|---|---|---|---|
| 3,046,120 | 7/1962 | Schmidt et. al . | |
| 3,126,281 | 3/1964 | Sus et. al . | |
| 3,201,239 | 8/1965 | Neugebauer et. al. | 430/193 |
| 3,395,016 | 7/1968 | Loeb . | |
| 3,493,371 | 2/1970 | Poot . | |
| 3,526,504 | 9/1970 | Celeste . | |
| 3,547,730 | 12/1970 | Cohen et. al. | 156/345 |
| 3,592,646 | 7/1971 | Holstead et. al. | |
| 3,629,039 | 12/1971 | Isaacson | 156/241 |
| 3,649,283 | 3/1972 | Christensen et. al. | 430/166 |
| 3,778,270 | 12/1973 | Roos | 430/326 |
| 3,782,939 | 1/1974 | Borham et. al. | 430/253 |
| 3,837,860 | 9/1974 | Roos | 430/326 |

FOREIGN PATENT DOCUMENTS 708016 6/1969 Belgium .
1128850 10/1968 United Kingdom .

OTHER PUBLICATIONS

Choate, R.A. et al., "Cases and Materials on Patent Law", 2nd Ed., West Publishing Co., 1981.

*Primary Examiner*—Charles L. Bowers, Jr.

[57] ABSTRACT

A process for forming a photoresist which comprises:
(1) applying to a surface the surface of a solid unexposed photosensitive layer of thermoplastic photosoluble or photodesensitizable material, the other surface being adhered to a film support, then in either order
(2) exposing the layer, and
(3) stripping the support, and then
(4) washing away the exposed areas of the layer.

The surface bearing the resist can be etched, plated or treated in other ways.

REEXAMINATION CERTIFICATE ISSUED UNDER 35 U.S.C. 307.

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 12-16 is confirmed.

Claim 1 is determined to be patentable as amended.

Claims 2-11 dependent on an amended claim, are determined to be patentable.

New claims 17-21 are added and determined to be patentable.

1. A process for forming a positive photoresist on a surface which comprises:
   (1) applying to said surface the surface of a solid, unexposed, positive-working, photosensitive layer *which adheres directly to said surface* and which is comprised of a resist-forming photosoluble or photodesensitizable composition, the other surface of the layer having adhered thereto with low to moderate adherence a thin, flexible, polymeric film support, then in either order,
   (2) exposing the layer, imagewise, to actinic radiation to form an image,
   (3) stripping the film support from the resulting image-bearing layer; and then,
   (4) washing away the exposed areas of the layer to form a positive resist image of thermoplastic material.

17. *The process of claim 1 wherein the layer is applied to said surface with heating.*

18. *The process of claim 1 wherein the polymeric film support is polyethylene terephthalate.*

19. *The process of claim 1 wherein the polymeric film support has a thickness of 0.00025 inch or more.*

20. *The process of claim 1 wherein the areas on the surface adjacent to and unprotected by the resist image are modified by etching or plating.*

21. *A process for forming a positive photoresist on a surface which comprises:*
   *(1) applying directly to said surface the surface of a solid, unexposed, positive-working photosensitive layer comprised of a resist-forming photosoluble or photodesensitizable composition selected from a photosoluble, thermoplastic, macromolecular organic polymer having pendant diazo quinone groups and a photodesensitizable mixture of a polymer having pendant hydroxyl or amino groups and a bisdiazonium salt, the other surface of the layer having adhered thereto with low to moderate adherence a thin, flexible, polymeric film support; then in either order,*
   *(2) exposing the layer, imagewise, to actinic radiation to form an image,*
   *(3) stripping the film support from the resulting image-bearing layer; and then,*
   *(4) washing away the exposed areas of the layer to form a positive resist image of thermoplastic material, and*
   *(5) modifying the adjacent areas on said surface unprotected by the resist image by etching or plating.*

* * * * *